United States Patent [19]

Atriss et al.

[11] Patent Number: 5,081,429
[45] Date of Patent: Jan. 14, 1992

[54] VOLTAGE CONTROLLED OSCILLATOR WITH CONTROLLED LOAD

[75] Inventors: Ahmad H. Atriss, Chandler; Benjamin C. Peterson, Tempe; Lanny L. Parker, Mesa, both of Ariz.

[73] Assignee: Codex Corp., Mansfield, Mass.

[21] Appl. No.: 677,056

[22] Filed: Mar. 29, 1991

[51] Int. Cl.⁵ .............................................. H03B 1/00
[52] U.S. Cl. ............................ 331/57; 331/108 b
[58] Field of Search .......... 331/25, 57, 108 R, 108 B, 331/135

[56] References Cited

U.S. PATENT DOCUMENTS

| | | | |
|---|---|---|---|
| 4,388,537 | 6/1983 | Kanuma | 331/57 X |
| 4,656,369 | 4/1987 | Lou | 331/57 X |
| 4,804,929 | 2/1989 | Kato et al. | 331/57 |
| 4,816,777 | 3/1989 | Benhamida | 331/57 |

*Primary Examiner*—Robert J. Pascal
*Attorney, Agent, or Firm*—Bradley J. Botsch

[57] ABSTRACT

A voltage controlled oscillator (VCO) includes a voltage controlled load. The voltage controlled load supplies additional capacitive loading to the VCO, via a transmission gate, at low frequencies to decrease the frequency-gain factor of the VCO. Moreover, at high frequencies, the effect of the voltage controlled load is minimized by turning off the transmission gate thereby allowing the VCO to operate at maximum frequency for worst case speed conditions.

12 Claims, 3 Drawing Sheets

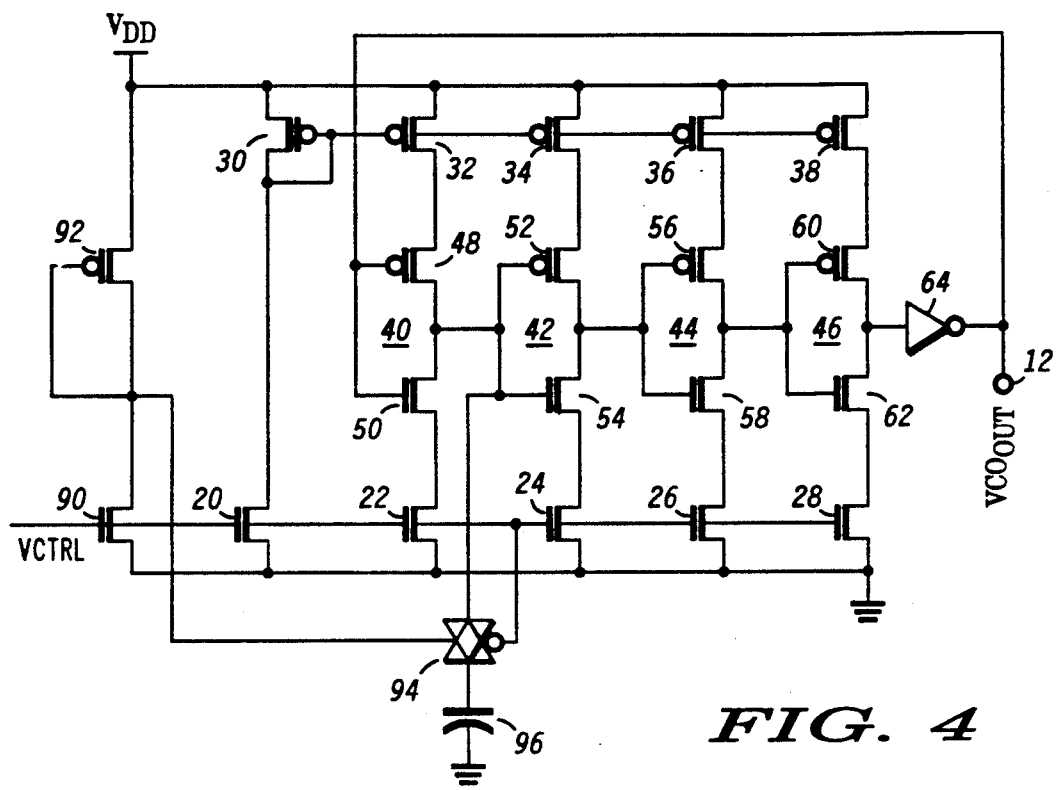
FIG. 4
FIG. 5
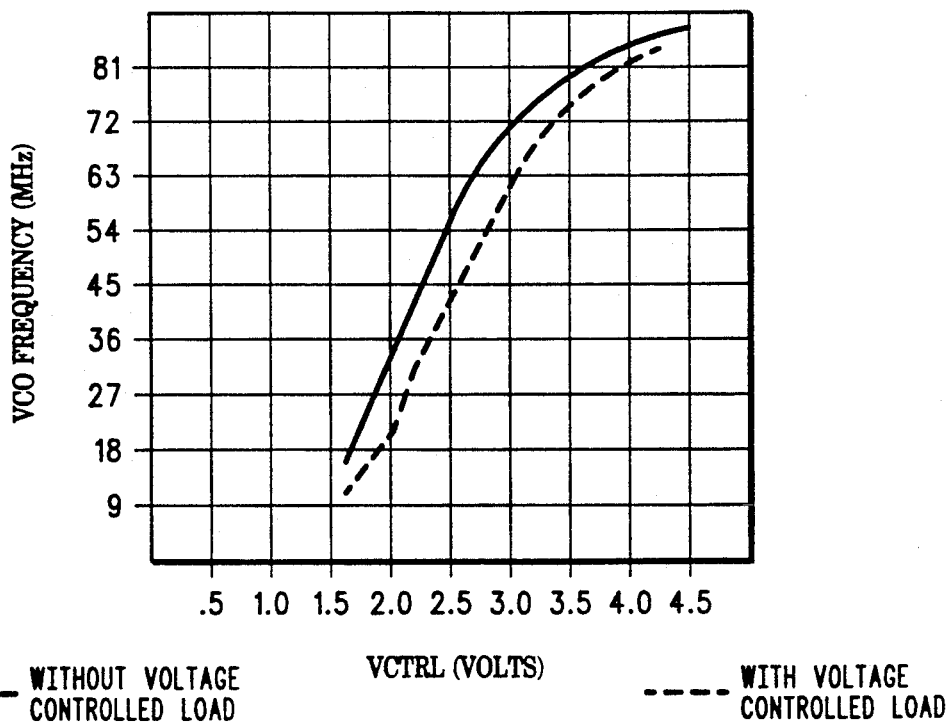
| —— WITHOUT VOLTAGE CONTROLLED LOAD | ---- WITH VOLTAGE CONTROLLED LOAD |

VOLTAGE CONTROLLED OSCILLATOR WITH CONTROLLED LOAD

CROSS REFERENCE TO RELATED APPLICATIONS

This application is related to the subject matter of an application having Ser. No. 07/677,057, a filing date of Mar. 29, 1991, and assigned to the same assignee of the subject application.

BACKGROUND OF THE INVENTION

This invention relates to oscillator circuits, for example, a voltage controlled oscillator circuit for a phase-lock-loop.

Phase-locked-loop (PLL) circuits are utilized in many applications to provide an output signal that is substantially the same frequency and phase of an input reference signal. The main components of a PLL circuit comprise a phase/frequency detector, a loop filter, a voltage controlled oscillator (VCO), and an optional divide by N block which is typically implemented with a counter. When in lock, the output signal of the VCO, signal $VCO_{OUT}$, is substantially N times the frequency and phase as the input reference signal. The phase/frequency detector typically has two inputs and two outputs. The two inputs include the input reference signal and the divide by N VCO feedback signal, signal $VCO_{OUT}/N$, while the two outputs of the phase/frequency detector provide an UP and a DOWN signal. The phase/frequency detector compares the input reference signal to signal $VCO_{OUT}/N$ and operates such that if the frequency of signal $VCO_{OUT}/N$ is lower than the frequency of the input reference signal, the UP signal functions to increase the operating frequency of the VCO. Furthermore, if the frequency of signal $VCO_{OUT}/N$ is at a higher frequency than the input reference signal, the DOWN signal functions to decrease the operating frequency of the VCO. Further, when the phase-locked-loop is in lock, the input reference signal and signal $VCO_{OUT}/N$ are substantially equal in frequency and phase.

When a PLL circuit is operating in the tracking mode, the frequency of signal $VCO_{OUT}/N$ matches the frequency of the input reference signal. In the tracking mode, the phase/frequency detector attempts to maintain the frequency of signal $VCO_{OUT}/N$ locked to the frequency of the input reference signal. However, the performance measures that characterize the tracking mode are very complicated to account for due to non-linearities in the phase/frequency detector and various noise sources. Further, tracking time is directly effected by the VCO frequency-gain factor at an operating point wherein the operating point is a function of the VCO frequency and the voltage applied across the loop filter while the frequency-gain factor is defined as the rate of change of the VCO frequency with respect to the rate of change of voltage applied to the loop filter.

Typical PLL circuits exhibit a high frequency-gain factor at low frequencies of operation while the frequency-gain factor tends to level off as the operating frequency increases. As a result, this typically leads to poor tracking time and cycle slipping at lower frequencies of operation.

Hence, a need exists for a voltage controlled oscillator circuit having adjustable tracking time with respect to the frequency of operation of the voltage controlled oscillator.

SUMMARY OF THE INVENTION

Briefly, there is provided a voltage controlled oscillator circuit including a plurality of inverters which are responsive to a control voltage for providing an output signal comprising a voltage controlled load responsive to the control voltage for providing capacitive loading at an output of at least one of the plurality of inverters.

It is an advantage of the present invention to provide a voltage controlled oscillator circuit having voltage controlled loads for decreasing the frequency-gain factor of the voltage controlled oscillator circuit at lower frequencies while not reducing the maximum frequency allowed for worst case speed conditions. It is also an advantage of the present invention to adjust the frequency-gain factor of a voltage controlled oscillator to improve tracking time at lower frequencies of operation.

The above and other advantages and features of the present invention will be better understood from the detailed description taken in conjunction with the accompanying drawings.

BRIEF DESCRIPTION OF THE DRAWING

FIG. 4 is a detailed schematic diagram illustrating a voltage controlled oscillator circuit having a voltage controlled load in accordance with the present invention; and FIG. 5 is a pictorial diagram of the frequency vs. voltage characteristic of the voltage controlled oscillator circuit of FIG. 2 and of the voltage controlled oscillator circuit with the voltage controlled load of FIG. 4.

DETAILED DESCRIPTION OF THE INVENTION

Figure 1:
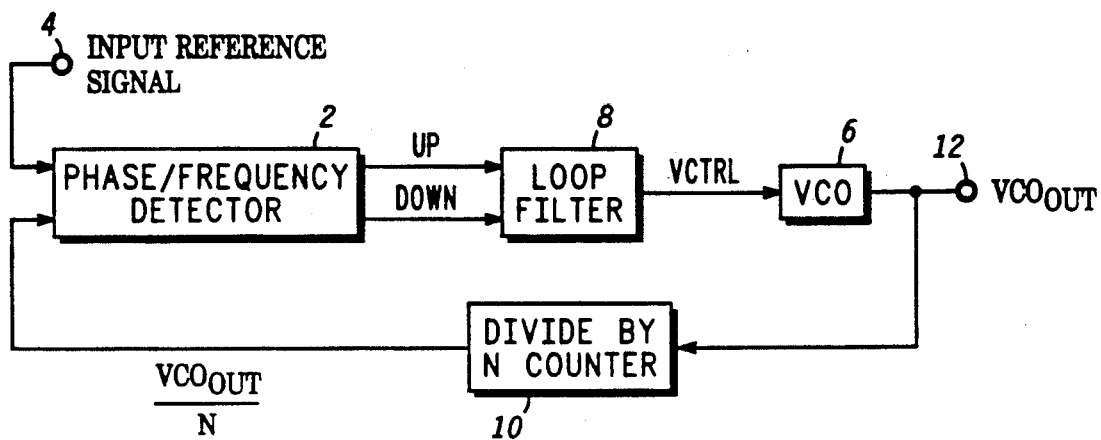
FIG. 1 is a block diagram illustrating a typical phase-locked-loop circuit.

Referring to FIG. 1, a block diagram illustrating a phase-locked-loop is shown comprising phase/frequency detector 2 having a first input coupled to input terminal 4 at which an input reference signal is applied and a second input coupled to an output of divide by N counter 10. The first output of phase/frequency detector 2 provides signal UP to a first input of loop filter 8 while the second output of phase/frequency detector 2 provides signal down to a second input of loop filter 8. The output of loop filter 8 supplies control voltage signal VCTRL to an input of voltage controlled oscillator (VCO) 6 wherein VCO 6 has an output for providing output signal $VCO_{OUT}$ at terminal 12. The output of VCO 6 is also coupled to an input of divide by N counter 10.

Briefly, the speed of VCO 6 is controlled by divide factor N wherein the output of divide by N counter 10 is compared to the input reference signal such that the higher the divide factor N, the faster VCO 6 needs to run to keep up with the input reference signal. In particular, phase/frequency detector 2 compares the input reference signal with the output signal of divide by N counter 10 and provides UP and DOWN output signals to loop filter 8. It is understood that divide by N counter 10 frequency divides its input signal $VCO_{OUT}$ by N thereby providing signal $VCO_{OUT}/N$ at its output. Loop filter 8 converts the digital outputs of phase/frequency detector 2 to analog control voltage VCTRL such that if signal $VCO_{OUT}/N$ is at a lower frequency than the input reference signal, then the UP signal will be in a first logic state thereby adjusting voltage VCTRL of loop filter 8 to increase the output frequency of VCO 6. Likewise, if signal $VCO_{OUT}/N$ is at a higher frequency than the input reference signal, then the DOWN signal will be in a first logic state thereby adjusting voltage VCTRL of loop filter 8 to decrease the output frequency of VCO 6. Further, when both the UP and DOWN signals are in a second logic state, signal $VCO_{OUT}/N$ is substantially the same phase and frequency of the input reference signal and VCO 6 will be oscillating at N times the input reference signal.

Figure 2:
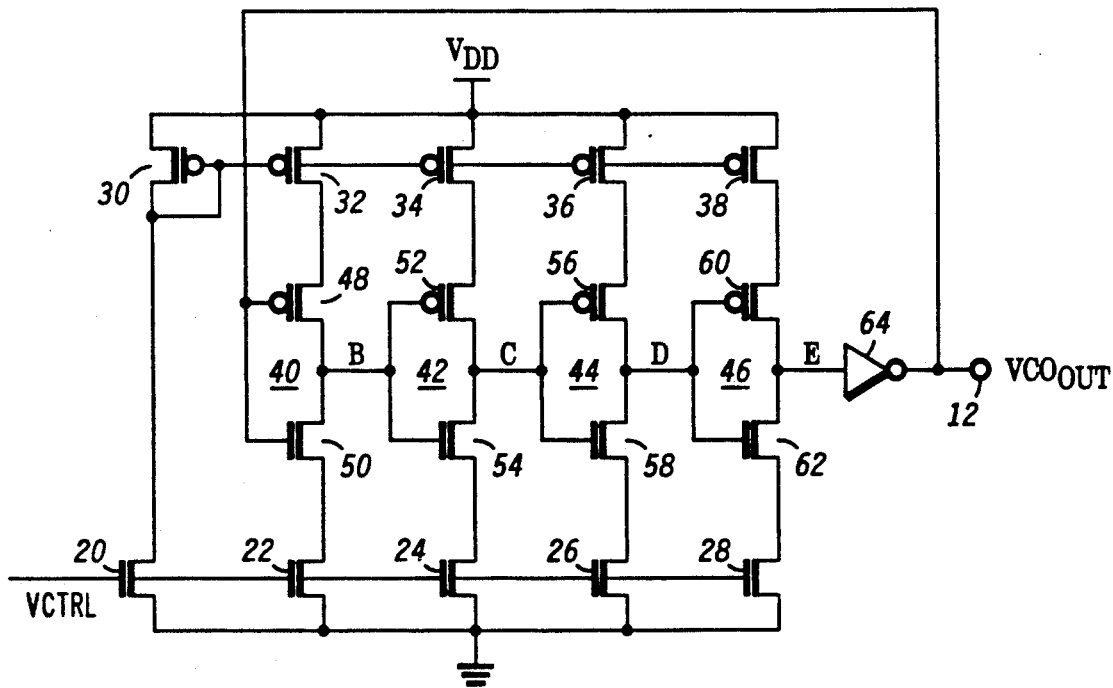
FIG. 2 is a detailed schematic diagram illustrating a voltage controlled oscillator circuit for a phase-locked-loop circuit.

Referring to FIG. 2, a detailed schematic diagram of a voltage controlled oscillator is shown comprising a first current mirror circuit which includes NMOS transistors 20, 22, 24, 26 and 28 wherein the gate electrodes of each are coupled to receive control voltage VCTRL and the source electrodes of each are returned to ground. The drain electrode of NMOS transistor 20 is coupled to the drain and gate electrodes of PMOS transistor 30 wherein a second current mirror circuit is formed by PMOS transistors 30, 32, 34, 36 and 38. The source electrode of PMOS transistor 30 is coupled to a first supply voltage terminal at which the operating potential $V_{DD}$ is applied. The gate electrodes of PMOS transistors 32, 34, 36 and 38 are coupled to the gate electrode of PMOS transistor 30 while the source electrodes of PMOS transistors 32, 34, 36 and 38 are coupled to receive operating potential $V_{DD}$. The voltage controlled oscillator also comprises voltage controlled CMOS inverters 40, 42, 44 and 46 wherein inverter 40 includes PMOS transistor 48 and NMOS transistor 50. Inverter 42 includes PMOS transistor 52 and NMOS transistor 54 while inverter 44 includes PMOS transistor 56 and NMOS transistor 58. Likewise, inverter 46 includes PMOS transistor 60 and NMOS transistor 62. The output of inverter 46 is coupled to an input of inverter 64, the latter having an output coupled back to the input of inverter 40. The output of inverter 64 also provides output signal $VCO_{OUT}$ at terminal 12. Further, the output of inverters 40, 42, 44 and 46 respectively provide signals B, C, D and E.

Turning back to inverters 40, 42, 44 and 46, the source electrodes of PMOS transistors 48, 52, 56 and 60 are respectively coupled to the drain electrodes of PMOS transistors 32, 34, 36 and 38. In a similar manner, the source electrodes of NMOS transistors 50, 54, 58 and 62 are respectively coupled to the drain electrodes of NMOS transistors 22, 24, 26 and 28. The gate electrodes of PMOS transistor 48 and NMOS transistor 50 are coupled to the output of inverter 64 while the common drain electrodes of the same are coupled to the common gate electrodes of PMOS transistor 52 and NMOS transistor 54. The common drain electrodes of PMOS transistor 52 and NMOS transistor 54 are coupled to the common gate electrodes of PMOS transistor 56 and NMOS transistor 58. Likewise, the common drain electrodes of PMOS transistor 56 and NMOS transistor 58 are coupled to the common gate electrodes of PMOS transistor 60 and NMOS transistor 62. Also, the drain electrodes of PMOS transistor 60 and NMOS transistor 62 are coupled to the input of inverter 64. It is understood that the common gate electrodes of PMOS and NMOS transistors 48 and 50 form the input of inverter 40. Likewise, the common gate electrodes of transistors 52 and 54, 56 and 58, and 60 and 62 respectively form the input of inverters 42, 44 and 46. Further, the common drain electrodes of PMOS and NMOS transistors 48 and 50 form the output of inverter 40. Likewise, the common drain electrodes of transistors 52 and 54, 56 and 58, and 60 and 62 respectively form the output of inverters 42, 44 and 46.

In operation, control voltage VCTRL supplies a voltage to the gate electrodes of NMOS transistors 20, 22, 24, 26 and 28 thereby providing corresponding currents to flow through NMOS transistors 20, 22, 24, 26 and 28. The current flowing through NMOS transistor 20 also flows through PMOS transistor 30. This current provides a predetermined voltage at the gate electrode of PMOS transistor 30 which is also applied to the gate electrodes of PMOS transistors 32, 34, 36 and 38 thereby providing corresponding predetermined currents to flow through PMOS transistors 32, 34, 36 and 38. It is understood that PMOS transistors 32, 34, 36 and 38 respectively source current to the outputs of inverters 40, 42, 44 and 46 when PMOS transistors 48, 52, 56 and 60 are rendered operative, respectively, thereby charging the respective voltages occurring thereat. Likewise, NMOS transistors 22, 24, 26 and 28 respectively sink current from the outputs of inverters 40, 42, 44 and 46 when NMOS transistors 50, 54, 58 and 62 are rendered operative, respectively, thereby discharging the respective voltages occurring thereat.

Figure 3:
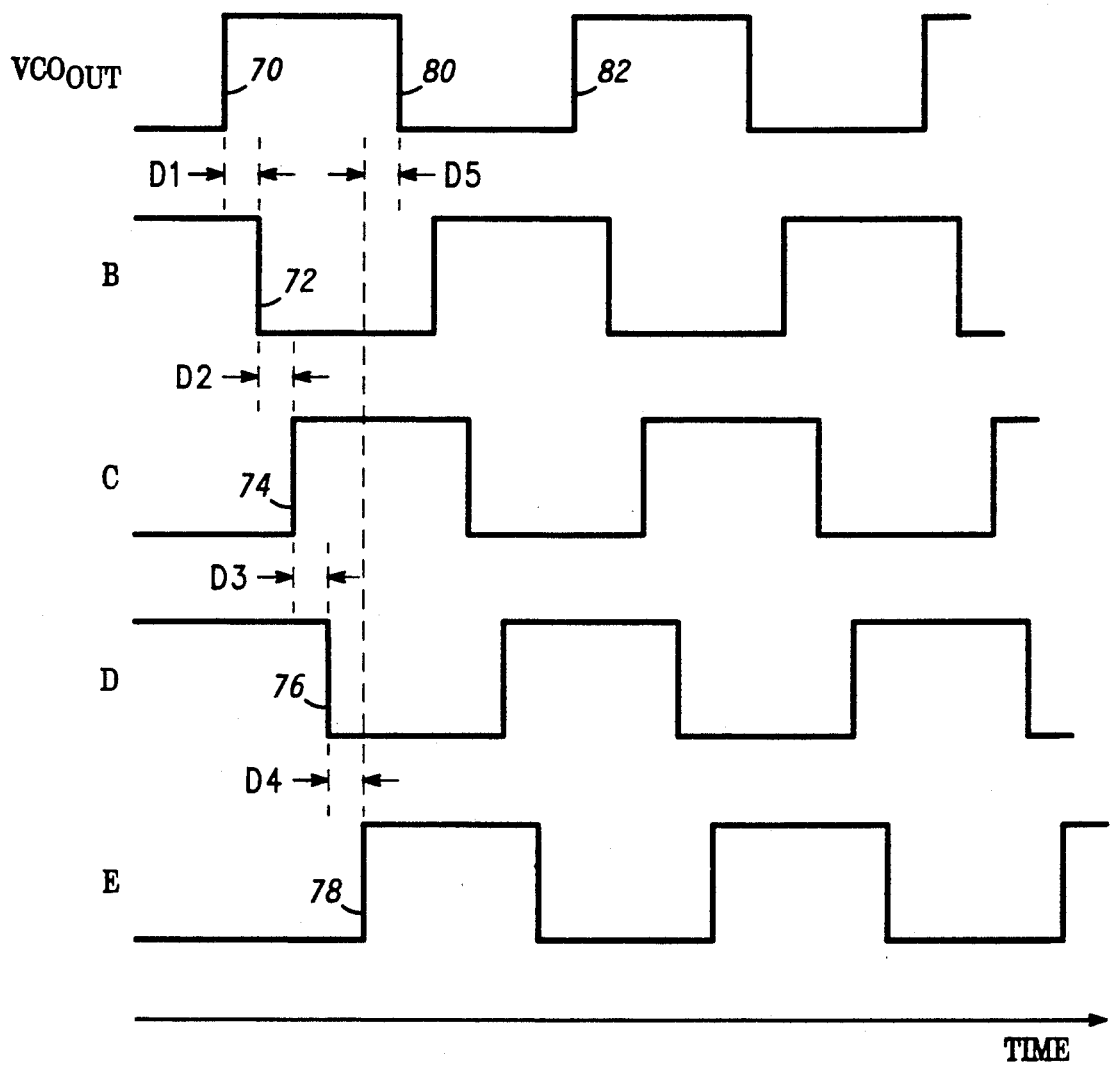
FIG. 3 is a graphical representation of various signals generated from the voltage controlled oscillator circuit of FIG. 2.

Referring to FIG. 3, a graphical representation of signals $VCO_{OUT}$, B, C, D and E is shown for illustrating how signal $VCO_{OUT}$ is generated. As a starting point, assume that rising transition 70 is occurring on signal $VCO_{OUT}$. This rising transition is fed back to the input of voltage controlled inverter 40 thereby generating falling transition 72 at the output of inverter 40 after a finite time delay of D1. It is understood that time delay D1 is a function of the propagation delay of inverter 40 and of the capacitance present at the output of inverter 40 wherein a larger the capacitance at the output of inverter 40 corresponds to a longer time delay D1 since it takes longer for a predetermined current to discharge the voltage at the output of inverter 40. Falling transition 72 is subsequently passed through voltage controlled inverter 42 thereby generating rising transition 74 at the output of inverter 42 after a finite time delay of D2. Likewise, time delay D2 is a function of the propagation delay of inverter 42 and of the capacitance present at the output of inverter 42 wherein a larger the capacitance at the output of inverter 42 corresponds to a longer time delay D2 since it takes longer for a predetermined current to charge the voltage at the output of inverter 42. In a similar manner, rising transition 74 is subsequently passed through voltage controlled inverter 44 thereby generating falling transition 76 at the output of inverter 44 after a finite time delay of D3. Also, falling transition 76 is then passed through voltage controlled inverter 46 thereby generating rising transition 78 at the output of inverter 46 after a finite time delay of D4. Now it must be realized that rising transition 78 is passed through inverter 64 to generate falling transition 80 on signal $VCO_{OUT}$ after a finite time delay of D5. It is understood that time delays D3, D4 and D5 are respectively a function of the propagation delays of inverters 44, 46 and 64 and of the capacitance present respectively at the outputs of inverters 44, 46 and 64. It should now be realized that rising transition 82 is generated by falling transition 80 being subsequently passed through inverters 40, 42, 44, 46 and 64 in a similar aforedescribed manner for rising transition 70. Hence, in this manner, signal $VCO_{OUT}$ is generated and provided at terminal 12.

As control voltage VCTRL is changed, the frequency of signal $VCO_{OUT}$ is correspondingly changed. For example, when control voltage VCTRL is increased, NMOS transistor 20 is turned on harder and, thus, more current flows through NMOS transistor 20 and PMOS transistor 30. This increased current is mirrored from NMOS transistor 20 to NMOS transistors 22, 24, 26 and 28 and from PMOS transistor 30 to PMOS transistors 32, 34, 36 and 38. As a result, more current is sourced and sunk to and from the outputs of inverters 40, 42, 44 and 46. This has the effect of decreasing time delays D1, D2, D3 and D4 since there is more current available to cause a transition respectively at the outputs of inverters 40, 42, 44 and 46. Hence, the frequency of signal $VCO_{OUT}$ increases. On the other hand, when control voltage VCTRL is decreased, NMOS transistor 20 is turned more off and, thus, less current flows through NMOS transistor 20 and PMOS transistor 30. This decreased current is mirrored from NMOS transistor 20 to NMOS transistors 22, 24, 26 and 28 and from PMOS transistor 30 to PMOS transistors 32, 34, 36 and 38. As a result, less current is sourced and sunk to and from the outputs of inverters 40, 42, 44 and 46. This has the effect of increasing time delays D1, D2, D3 and D4 since there is less current available to cause a transition respectively at the outputs of inverters 40, 42, 44 and 46. Hence, the frequency of signal $VCO_{OUT}$ decreases.

Referring to FIG. 4, a detailed schematic diagram illustrating the voltage controlled oscillator circuit of FIG. 2 having a voltage controlled load is shown. It is understood that components similar to those of FIG. 2 are referenced by like numbers. The VCO circuit of FIG. 4 further comprises NMOS transistor 90 which has a gate electrode coupled to receive control voltage VCTRL and a source electrode returned to ground. The drain electrode of NMOS transistor 90 is coupled to the drain and gate electrodes of PMOS transistor 92 while the source electrode of PMOS transistor is coupled to receive operating potential $V_{DD}$. Transmission gate 94 has a non-inverting control input coupled to the gate electrode of PMOS transistor 92 and an inverting control input coupled to receive control voltage VCTRL. Transmission gate 94 is coupled between the output of inverter 40 and a first terminal of capacitor 96 for passing current therethrough. The second terminal of capacitor 96 is returned to ground.

It must be understood that the frequency of signal $VCO_{OUT}$ is a function of time delays D1, D2, D3, D4 and D5 wherein as the sum of the time delays increases, the frequency of signal $VCO_{OUT}$ decreases as is known. On the other hand, as the sum of the time delays decreases, the frequency of signal $VCO_{OUT}$ increases. Thus, the present invention utilizes the fact that by switching in a capacitive load at the output of inverter 40, time delay D1 can be increased which slows down the rate of a transition occurring at the output of inverter 40 thereby decreasing the frequency of signal $VCO_{OUT}$. This has the effect of decreasing (reducing) the frequencygain factor of the voltage controlled oscillator. However, as control voltage VCTRL increases, this means that the frequency of the VCO needs to be increased. As a result, less loading is desired at the output of inverter 40 and transmission gate 94 needs to be turned more off thereby decreasing the capacitive load at the output of inverter 40. Turning off transmission gate 94 is accomplished by applying a higher voltage to its inverting control input and a lower voltage to its non-inverting control input. Further, as control voltage VCTRL increases, a higher voltage is applied to the inverting control input of transmission gate 94. In addition, as control voltage VCTRL increases, NMOS transistor 90 is turned more on and, thus, the voltage at the gate electrode of PMOS transistor 92 is lowered thereby lowering the voltage applied to the non-inverting control input of transmission gate 94. Therefore, as control voltage VCTRL is increased, transmission gate 94 is turned more off and the capacitive load at the output of inverter 40 is reduced. Thus, time delay D1 is decreased which speeds up the rate of a transition occurring at the output of inverter 40 thereby increasing the frequency of signal $VCO_{OUT}$. This allows the voltage controlled oscillator to operate at a maximum frequency for worst case speed conditions. In summary, at lower frequencies, control voltage VCTRL is small and capacitor 96 provides additional capacitive loading at the output of inverter 40 via transmission gate 94. However, at higher frequencies, control voltage VCTRL is larger and the loading effect of capacitor 96 at the output of inverter 40 is minimized by turning off transmission gate 94.

It is an advantage of the present invention to couple a capacitive load to at least one output of inverters 40, 42, 44 and 46 to respectively control time delays D1-D5. As the frequency of the VCO decreases, control voltage VCTRL also decreases and the effect of the capacitive load is increased and the sum of time delays D1-D5 increases. However, as the frequency of the VCO increases, control voltage VCTRL also increases and the effect of the capacitive load is decreased and the sum of time delays D1-D5 decreases.

Referring to FIG. 5, a pictorial diagram of the frequency vs. voltage characteristic of the voltage controlled oscillator circuit with and without a voltage controlled load is shown. The curves in FIG. 5 illustrate the effect that capacitor 96 has on the frequency vs. voltage characteristic of the VCO. The top curve represents the frequency vs. voltage characteristic of the VCO without the novel voltage controlled load as illustrated in the circuit of FIG. 2. The bottom curve represents the frequency vs. voltage characteristic of the VCO with the novel voltage controlled load as illustrated in the circuit of FIG. 4. From FIG. 5, it can be seen that for low frequencies the slope of the bottom curve is substantially less than the slope of the top curve. However, as the frequency increases, the slope of the two curves begin to level off and are more equal to each other. Thus, it should be realized that the voltage controlled load has the effect of reducing the slope of the frequency vs. voltage characteristic of the VCO at low frequencies while not effecting the slope of the frequency vs. voltage characteristic of the VCO at high frequencies. As a result, the frequency-gain factor of the VCO is decreased at low frequencies while being unaffected at high frequencies.

The present invention utilizes capacitive load 96 to provide additional capacitive loading at the output of inverter 40 for low operating frequencies of a voltage controlled oscillator. As a result, the frequency-gain factor of the VCO decreases. However, as the operating frequency of the VCO increases, control voltage VCTRL is also increased which effectively turns transmission gate 94 more off thereby decreasing the capacitive loading at the output of inverter 40. As a result, the VCO can operate at a maximum frequency. Thus, the present invention provides a voltage controlled load at the output of inverter 40 to adjust the capacitive loading thereat with respect to frequency.

It is worth noting that capacitive load 96 can be utilized with any voltage controlled oscillator and, thus, is not restricted to use with the voltage controlled oscillator circuit shown in FIG. 2. Hence, voltage controlled capacitive load 96 can be coupled to an output of an inverter of any voltage controlled oscillator to provide additional capacitive loading at the output of the inverter for low operating frequencies as aforedescribed.

It must now be realized that the tracking time of a PLL circuit can be reduced by decreasing the frequency-gain factor of the VCO which will cause the loop filter to respond less quickly to input variations. Further, decreasing the frequency-gain factor of the VCO will also reduce cycle slipping. Thus, since the present invention utilizes a voltage controlled load to adjust the frequency-gain factor of a voltage controlled oscillator with respect to frequency, it should be clear that the present invention can also adjusts the tracking time of the PLL circuit with respect to frequency. In particular, when the VCO is operating at low frequencies, voltage controlled load 96 supplies additional capacitive loading at the output of inverter 40 which decreases the frequency-gain factor of the VCO and reduces the tracking time of the PLL circuit. On the other hand, when the VCO is operating at high frequencies, voltage controlled load 96 does not supply additional capacitive loading at the output of inverter 40 since transmission gate 94 is turned off. Therefore, no additional capacitive loading is supplied at the output of inverter 40 and the VCO is allowed to operate at a maximum frequency for worst case speed conditions.

It is worth noting that although capacitive load 96 is shown in FIG. 4 as being coupled to the output of inverter 40, it should be understood that capacitive load 94 could also have been coupled to the output of inverters 42, 44 or 46. Moreover, a capacitive load could be coupled to any number of outputs of inverters 40, 42, 44 and 46 thereby providing even more capacitive loading at lower frequencies of operation.

By now it should be apparent that a novel voltage controlled oscillator circuit having voltage controlled loads has been provided for adjusting the frequency-gain factor of the VCO as a function of operating frequency.

What is claimed is:

1. In a phase-locked loop circuit, a voltage controlled oscillator circuit, comprising:
   a first current mirror circuit responsive to a control voltage for supplying a first plurality of currents;
   a second current mirror circuit responsive to said control voltage for supplying a second plurality of currents;
   a plurality of serially coupled inverters for providing an output signal at an output of a last one of said plurality of serially coupled inverters, each one of said plurality of serially coupled inverters being responsive to respective ones of said first and second plurality of currents;
   means for coupling said output of said last one of said plurality of serially coupled inverters to an input of a first one of said plurality of serially coupled inverters; and
   a voltage controlled load responsive to said control voltage for providing capacitive loading at an output of at least one of said plurality of serially coupled inverters.

2. The voltage controlled oscillator circuit according to claim 1 wherein said voltage controlled load includes:
   a transmission gate responsive to said control voltage and having first and second terminals, said first terminal of said transmission gate being coupled to an output of a first one of said plurality of serially coupled inverters; and
   a capacitor having first and second terminals, said first terminal of said capacitor being coupled to said second terminal of said transmission gate, and said second terminal of said capacitor being coupled to a first supply voltage terminal.

3. The voltage controlled oscillator circuit according to claim 2 wherein said first current mirror circuit includes:
   a first transistor having first, second and control electrodes, said control electrode of said first transistor being coupled to receive said control voltage, and said second electrode of said first transistor being coupled to said first supply voltage terminal, and said first electrode of said first transistor being coupled to said second current mirror circuit;
   a second transistor having first, second and control electrodes, said first electrode of said second transistor being coupled for providing a first one of said first plurality of currents, said control electrode of said second transistor being coupled to said control voltage, and said second electrode of said second transistor being coupled to said first supply voltage terminal;
   a third transistor having first, second and control electrodes, said first electrode of said third transistor being coupled for providing a second one of said first plurality of currents, said control electrode of said third transistor being coupled to receive said control voltage, and said second electrode of said third transistor being coupled to said first supply voltage terminal;
   a fourth transistor having first, second and control electrodes, said first electrode of said fourth transistor being coupled for providing a third one of said first plurality of currents, said control electrode of said fourth transistor being coupled to receive said control voltage, and said second electrode of said fourth transistor being coupled to said first supply voltage terminal; and
   a fifth transistor having first, second and control electrodes, said first electrode of said fifth transistor being coupled for providing a fourth one of said first plurality of currents, said control electrode of said fifth transistor being coupled to said control voltage, and said second electrode of said fifth transistor being coupled to said first supply voltage terminal.

4. The voltage controlled oscillator circuit according to claim 3 wherein said second current mirror circuit includes:
   a first transistor having first, second and control electrodes, said control and first electrodes of said first transistor of said second current mirror circuit being coupled to said first electrode of said first transistor of said first current mirror circuit, and said second electrode of said first transistor of said second current mirror circuit being coupled to a second supply voltage terminal;

a second transistor having first, second and control electrodes, said first electrode of said second transistor of said second current mirror circuit being coupled for providing a first one of said second plurality of currents, said control electrode of said second transistor of said second current mirror circuit being coupled to said control electrode of said first transistor of said second current mirror circuit, and said second electrode of said second transistor of said second current mirror circuit being coupled to said second supply voltage terminal;

a third transistor having first, second and control electrodes, said first electrode of said third transistor of said second current mirror circuit being coupled for providing a second one of said second plurality of currents, said control electrode of said third transistor of said second current mirror circuit being coupled to said control electrode of said first transistor of said second current mirror circuit, and said second electrode of said third transistor of said second current mirror circuit being coupled to said second supply voltage terminal;

a fourth transistor having first, second and control electrodes, said first electrode of said fourth transistor of said second current mirror circuit being coupled for providing a third one of said second plurality of currents, said control electrode of said fourth transistor being coupled to said control electrode of said first transistor of said second current mirror circuit, and said second electrode of said fourth transistor of said second current mirror circuit being coupled to said second supply voltage terminal; and a fifth transistor having first, second and control electrodes, said first electrode of said fifth transistor of said second current mirror circuit being coupled for providing a fourth one of said second plurality of currents, said control electrode of said fifth transistor of said second current mirror circuit being coupled to said control electrode of said first transistor of said second current mirror circuit, and said second electrode of said fifth transistor of said second current mirror circuit being coupled to said second supply voltage terminal.

5. The voltage controlled oscillator circuit according to claim 4 wherein each one of said plurality of serially coupled inverters includes:

a first transistor having first, second and control electrodes, said first electrode of said first transistor of each one of said plurality of serially coupled inverters being respectively coupled to an output of each one of said plurality of serially coupled inverters, said control electrode of said first transistor of each one of said plurality of serially coupled inverters being respectively coupled to an input of each one of said plurality of serially coupled inverters, and said second electrodes of said first transistor of each one of said plurality of serially coupled inverters being respectively coupled to receive said first plurality of currents of said first current mirror circuit, and a second transistor having first, second and control electrodes, said first electrode of said second transistor of each one of said plurality of serially coupled inverters being respectively coupled to said first electrode of said first transistor of each one of said plurality of serially coupled inverters, said control electrode of said second transistor of each one of said plurality of serially coupled inverters being respectively coupled to said control electrode of said first transistor of each one of said plurality of serially coupled inverters, and said second electrodes of said second transistors of each one of said plurality of serially coupled inverters being respectively coupled to receive said second plurality of currents of said second current mirror circuit.

6. The voltage controlled oscillator circuit according to claim 5 wherein said means includes an inverter having an input coupled to said output of said last one of said plurality of serially coupled inverters and an output coupled to said input of said first one of said plurality of serially coupled inverters, said output of said inverter of said means providing an output of the voltage controlled oscillator circuit.

7. A circuit for providing an output signal, comprising:

first circuit means responsive to a control voltage for sinking a first plurality of currents;

second circuit means responsive to said control voltage for sourcing a second plurality of currents;

feedback circuit means responsive to respective ones of said first and second plurality of currents for providing the output signal, said feedback circuit means having an output coupled to an input of said feedback circuit means; and third circuit means responsive to a predetermined range of said control voltage for providing capacitive loading to said feedback circuit means.

8. The circuit according to claim 7 wherein said third circuit means includes:

a transmission gate having first and second terminals, said first terminal of said transmission gate being coupled to said feedback circuit means, said transmission gate being rendered operative when said control voltage is within said predetermined range; and a capacitor having first and second terminals, said first terminal of said capacitor being coupled to said second terminal of said transmission gate, and said second terminal of said capacitor being coupled to a first supply voltage terminal.

9. The circuit according to claim 8 wherein said first circuit means includes:

a first transistor having first, second and control electrodes, said first electrode of said first transistor being coupled for sinking a first one of said first plurality of currents, said control electrode of said first transistor being coupled to said control voltage, and said second electrode of said first transistor being coupled to said first supply voltage terminal;

a second transistor having first, second and control electrodes, said first electrode of said second transistor being coupled for sinking a second one of said first plurality of currents, said control electrode of said third transistor being coupled to receive said control voltage, and said second electrode of said second transistor being coupled to said first supply voltage terminal;

a third transistor having first, second and control electrodes, said first electrode of said third transistor being coupled for sinking a third one of said first plurality of currents, said control electrode of said third transistor being coupled to receive said control voltage, and said second electrode of said third transistor being coupled to said first supply voltage terminal; and a fourth transistor having first, second and control electrodes, said first electrode of said fourth transistor being coupled for sinking a fourth one of said first plurality of currents, said control electrode of said fourth transistor being coupled to said control voltage, and said second electrode of said fourth transistor being coupled to said first supply voltage terminal.

10. The circuit according to claim 9 wherein said second circuit means includes:

a first transistor having first, second and control electrodes, said first electrode of said first transistor of said second circuit means being coupled for sourcing a fist one of said second plurality of currents, said control electrode of said first transistor of said second circuit means being coupled to said control voltage, and said second electrode of said second transistor of said second circuit means being coupled to a second supply voltage terminal;

a second transistor having first, second and control electrodes, said first electrode of said second transistor of said second circuit means being coupled for sourcing a second one of said second plurality of currents, said control electrode of said second transistor of said second circuit means being coupled to said control electrode of said first transistor of said second circuit means, and said second electrode of said second transistor of said second circuit means being coupled to said second supply voltage terminal;

a third transistor having first, second and control electrodes, said first electrode of said third transistor of said second circuit means being coupled for sourcing a third one of said second plurality of currents, said control electrode of said third transistor of said second circuit means being coupled to said control electrode of said first transistor of said second circuit means, and said second electrode of said third transistor of said second circuit means being coupled to said second supply voltage terminal; and a fourth transistor having first, second and control electrodes, said first electrode of said fourth transistor of said second circuit means being coupled for sourcing a fourth one of said second plurality of currents, said control electrode of said fourth transistor of said second circuit means being coupled to said control electrode of said first transistor of said second circuit means, and said second electrode of said fourth transistor of said second circuit means being coupled to said second supply voltage terminal.

11. The circuit according to claim 10 wherein said feedback circuit means includes:

a plurality of serially coupled voltage controlled inverters, each one of said plurality of serially coupled voltage controlled inverters being coupled to receive said respective ones of said first and second plurality of currents and said second plurality of currents; and an inverter circuit having an input and an output, said input of said inverter circuit being coupled to an output of a last one of said plurality of serially coupled voltage controlled inverters, said output of said inverter circuit being coupled to an input of a first one of said plurality of serially coupled voltage controlled inverters, said output of said inverter circuit providing the output signal of the circuit.

12. A voltage controlled oscillator circuit including a plurality of inverters which are responsive to a control voltage for providing an output signal, comprising a voltage controlled load responsive to said control voltage for providing capacitive loading at an output of at least one of said plurality of inverters, said voltage controlled load including:

a transmission gate responsive to said control voltage and having first and second terminals, said first terminal of said transmission gate being coupled to an output of a first one of said plurality of inverters; and a capacitor having first and second terminals, said first terminal of said capacitor being coupled to said second terminal of said transmission gate, and said second terminal of said capacitor being coupled to a first supply voltage terminal.

* * * * *